(12) United States Patent
Bohn et al.

(10) Patent No.: US 7,092,691 B2
(45) Date of Patent: Aug. 15, 2006

(54) SWITCHLESS MULTI-RESONANT, MULTI-BAND POWER AMPLIFIER

(75) Inventors: Florian Bohn, Goleta, CA (US); Seyed-Ali Hajimiri, Pasadena, CA (US)

(73) Assignee: California Insitute of Technology, Pasadena, CA (US)

( * ) Notice: Subject to any disclaimer, the term of this patent is extended or adjusted under 35 U.S.C. 154(b) by 458 days.

(21) Appl. No.: 10/094,055

(22) Filed: Mar. 8, 2002

(65) Prior Publication Data

US 2002/0180534 A1 Dec. 5, 2002

Related U.S. Application Data

(60) Provisional application No. 60/274,543, filed on Mar. 9, 2001.

(51) Int. Cl.
*H04B 1/18* (2006.01)

(52) U.S. Cl. ............... 455/280; 455/281; 455/282

(58) Field of Classification Search ............ 455/280, 455/281, 282, 552.1, 553.1, 253.2, 251.1, 455/80, 81, 107; 330/302, 306
See application file for complete search history.

(56) References Cited

U.S. PATENT DOCUMENTS 5,995,814 A * 11/1999 Yeh ................ 455/180.1

6,242,986 B1 * 6/2001 Adar ................ 330/302

FOREIGN PATENT DOCUMENTS

| EP | 0 886 384 A2 | 12/1998 |
|----|---|---|
| EP | 1 081 849 A1 | 3/2001 |
| WO | WO 01/73942 A2 | 10/2001 |

OTHER PUBLICATIONS

Search Report for PCT/US02/07245 Dated Aug. 19, 2003 in copending PCT filing of U.S. application filed herewith.
Inoue, et al, "High-Efficiency 0.1 cc Power Amplifier Module for 900 MHz Personal Digital Cellular Telephones", IEICE Trans Electron, vol. E82-C, No. 11, Nov. 1999, pp. 1906-1912.

* cited by examiner

*Primary Examiner*—Matthew D. Anderson
*Assistant Examiner*—Sanh Phu
(74) *Attorney, Agent, or Firm*—Christopher J. Rourk; Jackson Walker L.L.P.

(57) ABSTRACT

The present invention discloses a generic approach to the design of single-path, switchless multi-resonant, multi-band power amplifiers. In the preferred embodiments, the amplifier includes one or more amplification stages, a switchless, multi-resonant, input impedance network, a switchless, multi-resonant, output impedance network, and if multi-stage, a switchless, multi-resonant, interstage impedance network between each amplification stage. Multi-band amplification is accomplished without the need for externally-applied, frequency-indicating control signals. Moreover, the amplifier may be designed to provide concurrent multi-band amplification or non-concurrent amplification.

9 Claims, 17 Drawing Sheets

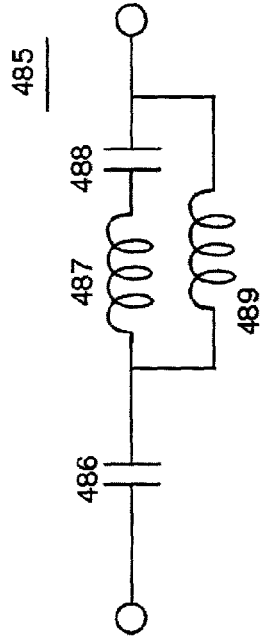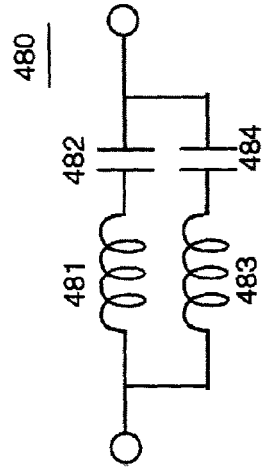

SWITCHLESS MULTI-RESONANT, MULTI-BAND POWER AMPLIFIER

CROSS-REFERENCE TO RELATED APPLICATION

This application claims the benefit of U.S. Provisional Application No. 60/274,543, filed Mar. 9, 2001.

FIELD OF THE INVENTION

The invention described herein relates to the field of tuned amplifiers and more particularly, to transmitter amplifiers used for wireless communications systems.

BACKGROUND OF THE INVENTION

Multi-band wireless transceiver systems have been proposed to address an increasing demand for bandwidth enhancement and flexibility of wireless telecommunication systems. Many different standards for such systems are currently in use around the world. Each of these standards sets forth specifications for various aspects of the communication link, such as the frequency of the transmitted signal, its spectral purity to avoid interference with other services and the scheme used for encoding information in the signal. Examples of different systems currently in use are the GSM900 mobile communication system popular in Europe and parts of Asia and the PCS1900 system in North America. Many other systems are used for various purposes, and most of these systems specify a different frequency for operation.

The use of different standards in different or even the same area on the globe creates challenges to system providers who would like to offer flexible systems capable of complying with a multitude of the standards in use. The increased flexibility of such multi-band communication systems can potentially provide various benefits to the end-user. For example, a dual-band cellular phone complying both with the GSM900 and the PCS1900 systems can use these services in North America, Asia and Europe, and its user would not be required to use a different phone when traveling outside its service area. Another application could be a communication system that uses different standards in the same area depending on outside circumstances such as to select the best frequency band that offers the best reception. Other possible applications are systems that use different frequency bands for different functionalities, such as equipment combining a GSM900 cellular phone with a global-positioning system (GPS) device. Many such applications are possible.

In wireless transmitters, signal amplifiers are often tuned for the frequency of intended operation. Tuning provides improved operation with respect to the gain provided by the amplifier, the spectral purity of the amplified signal, and the mode of operation (e.g. Class, A, Class AB, Class B and Class F, among others), all of which are designed to comply with the communication standards set for the intended use. Furthermore, tuning may also allow more efficient operation with respect to power consumption than can be achieved by broadband amplifiers.

Thus, communication systems designed to transmit signals at a multitude of frequencies must be able to amplify signals at each one of these frequencies. This is hereinafter called "multi-band" amplification.

Various design strategies have been disclosed in the art that ostensibly expand the functionality of power amplifiers that are designed into wireless transmitters. For example, U.S. Pat. No. 5,060,294 to Schwent et al. describes a dual-mode power amplifier. A dual-mode power amplifier is an amplifier operating in one of two different modes in a single frequency band. Such an amplifier, however, is not capable of operating in more than one frequency band, but rather is capable of being operated either in linear (analog) mode or saturated (digital) mode, thereby improving the utility of the amplifier for applications requiring differently modulated signals.

U.S. Pat. No. 5,774,017 to Adar describes a dual-band power amplifier, defined as an amplifier that tunes a signal at two frequencies of operation. This is accomplished by applying an external frequency-indicating control signal to the networks, and more specifically by (1) selectively coupling the signal to a variety of impedance networks; or (2) selectively coupling the signal to parts of the impedance networks; or (3) by changing component impedances in the impedance-tuning networks used in the amplifier, depending on the signal frequency.

In general, selective coupling can be achieved in several conventional ways. In one method, active components are used, namely, components that act as switches or variable conductors controlled by a signal indicating the frequency of signal. In a second method, filters connected in parallel are employed, such that each of these filters accept a signal at only one frequency and reject signals at all other frequencies. In this way, a signal is routed through only one of the filters depending on the frequency of the signal. This latter method is known as diplexing.

Unfortunately, designs involving techniques of selective coupling as mentioned above, however, suffer from several drawbacks. Techniques employing switched networks or diplexers use some or all components in the networks only for one frequency band, hence they tend to employ more components than is desirable. Reducing the components count can directly benefit a system's cost and reliability. Moreover, switches used to route the signal introduce losses while offering little other functionality. Finally, techniques using selectively coupled networks or selectively controlled component impedances, are inherently incapable of amplifying signals in more than one frequency band at the same time.

Thus it would be highly desirable to have a multi-band power amplifier design that minimizes component count and that does not rely on selective coupling or diplexing.

Recent advances in design methodology of dual-band receivers, and in particular of dual-band low-noise receiver amplifiers, have shown improvements in existing functionality of dual-band low-noise receiver amplifiers as well as introducing the possibility for concurrent dual-band operation by the use of inherently dual-resonant impedance networks instead of selective impedance network coupling or network impedance controlling schemes such as described in U.S. Pat. No. 5,774,017.

It is therefore an object of the invention to provide a switchless multi-resonant, multi-band power amplifier that can operate without any frequency indicating control signal schemes.

SUMMARY OF THE INVENTION

The present invention, which addresses these needs, resides in a switchless, tuned, power amplifier capable of delivering power to one load at different frequencies or frequencies bands. The present invention introduces multi-resonant networks, which are impedance networks that in a meaningful way modify a single load impedance at a multitude of design frequencies. These networks eliminate the need for 1) frequency-indicating control signals that change filter characteristics and 2) routing the signal through different filters or parts thereof depending on the frequency of operation by means of active switches or diplexing methods.

In one aspect of the invention a single-path, multi-band amplifying apparatus for amplifying a signal having a frequency in one of a plurality of predetermined frequency bands is disclosed. The apparatus which preferably, but not necessarily, is a power amplifier or a portion thereof, includes a first amplifying stage having a signal input and a signal output, for amplifying the signal, and a switchless, multi-resonant, output impedance network having an input port connected to the signal output of the amplifying stage. The output impedance network provides a predetermined output impedance at any frequency in the one of the plurality of predetermined frequency bands of the signal independent of an externally-applied, frequency-indicating control signal. The amplifying apparatus can be connected to an input signal. Preferably it further includes an input impedance network having an output port connected to the signal input of the amplifying stage and the input signal is fed into the network. More particularly, the input impedance network is a switchless, multi-resonant, input impedance network that provides a predetermined input impedance at each frequency in the one of the plurality of predetermined frequencies of the signal independent of an externally-applied, frequency-indicating control signal. The first amplifying stage may be a three-terminal active device, such as a CMOS transistor.

In another aspect of the present invention, the amplifying apparatus further includes a second amplifying stage having a signal input and a signal output, for further amplifying the signal. In this multi-stage embodiment, an interstage impedance network is provided between the stages. In particular, it has an input connected to the signal output of the first amplifying stage and an output connected to the signal input of the second amplifying stage. Thus, the network provides a predetermined impedance at any of the frequencies in the predetermined frequency bands of the signal. It should be understood that the number of frequency bands in which the apparatus of this present invention can amplify a signal is limited by the number of bands in which each impedance network in the signal path can effectuate appropriate impedance transformation. Thus, a dual-band apparatus will have dual-resonant impedance networks throughout the apparatus, and so on.

When biased to operate in certain modes, the amplifier of the present invention is capable of amplifying signals containing more than one frequency of the above frequencies or frequency bands. The use of multi-resonant impedance networks as employed in this invention offers numerous advantages compared to the selectively-coupled networks used in current multi-band power amplifier designs. Some of these advantages include (1) enabling a system using such networks to operate concurrently in two or more bands; that is correctly operating when signals at both frequencies are present at the same time, which is not possible when selectively coupled networks are used; and (2) reducing component count while offering the same functionality since all components are electrically functional at either operation frequency. The use of fewer components in a design potentially reduces production cost and increases reliability.

In a further aspect of the invention, a single-path, concurrent, multi-band, amplifying apparatus for substantially simultaneously amplifying a plurality of signals each having a frequency within a different one of a plurality of predetermined frequency bands, is provided. The apparatus includes an amplifying stage having a signal input and a signal output, for amplifying the signals, and a switchless, multi-resonant, output impedance network having an input port connected to the output of the amplifying stage that substantially simultaneously provides a predetermined output impedance at the frequency of each of the signals. This is accomplished independent of an externally-applied, frequency-indicating control signal. In a more detailed embodiment, the apparatus further includes an input impedance network. Preferably this network is a switchless, multi-resonant, input impedance network having an output port connected to the signal input of the amplifying stage that substantially simultaneously provides a predetermined input impedance at the frequency of each of the signals independent of an externally-applied, frequency-indicating control signal.

In yet a further aspect of the invention, a single path, dual-band, amplifying apparatus for amplifying a signal in either of two preselected frequency bands is disclosed. The apparatus includes an amplifying stage having two active devices interconnected as a differential pair, each device having a signal input and a signal output, for amplifying the signal and input and output impedance networks. The input network is a switchless, dual-resonant, input impedance network having an output port connected to each signal input of the amplifying stage. The input network provides a predetermined input impedance at any frequency in either of the two frequency bands of the signal independent of an externally-applied, frequency-indicating control signal. The output network is a switchless, dual-resonant, output impedance network having an input port connected to each signal output of the amplifying stage. The output network provides a predetermined output impedance at any frequency in either of the two frequency bands of the signal independent of an externally-applied, frequency-indicating control signal. In one preferred embodiment, the amplification stage includes two MOSFET transistors.

Still other aspects of the invention are directed to a method for amplifying a signal in two or more frequency bands in a single path, without switches and without applying an external signal-indicating control signals. Still other objects, advantages and features of the invention will be apparent from the detailed descriptions which follow in combination with the attached drawings.

BRIEF DESCRIPTION OF THE DRAWINGS

FIGS. 5e–5g are alternative embodiments of the impedance network circuit shown in FIG. 5b;

FIGS. 5h–5j are alternative embodiments of the impedance network circuit shown in FIG. 5d;

DETAILED DESCRIPTION OF THE PREFERRED EMBODIMENTS

The present invention discloses a novel, single path, power amplifier using switchless multi-resonant impedance networks that delivers an amplified signal supplied by one source to one load. The amplifier may include multiple amplification stages when gain from one stage is insufficient for a given purpose.

Figure 1A:
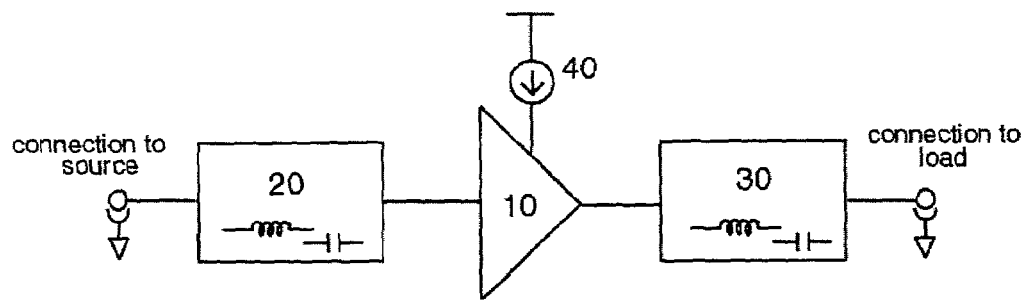
FIG. 1a is a block diagram of an example of a conventional single-stage power amplifier topology.
Figure 1B:
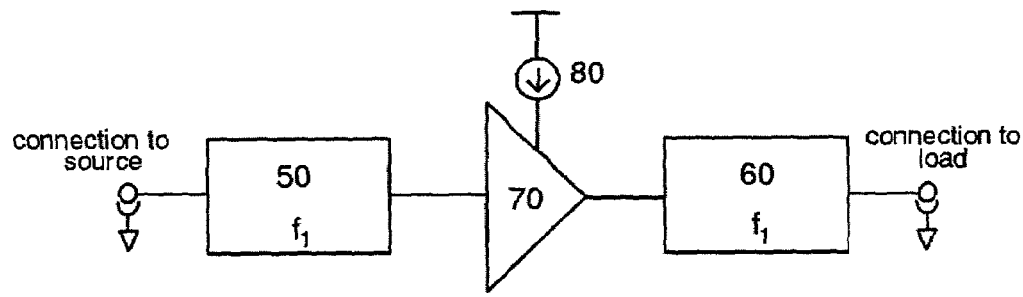
FIG. 1b is a block diagram of two single-stage power amplifiers, operating at different frequencies.
Figure 1B:
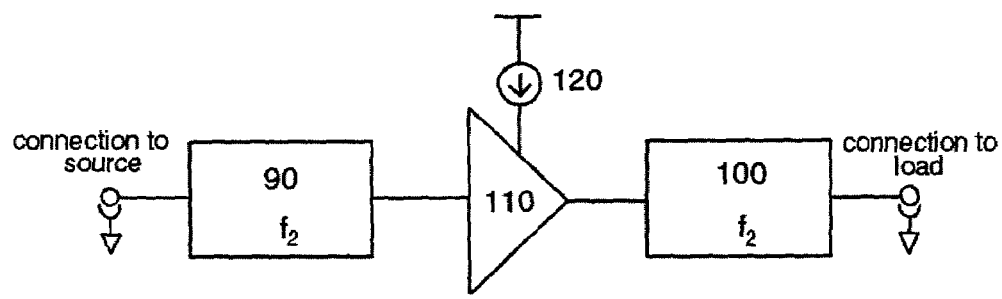
Figure 1C:
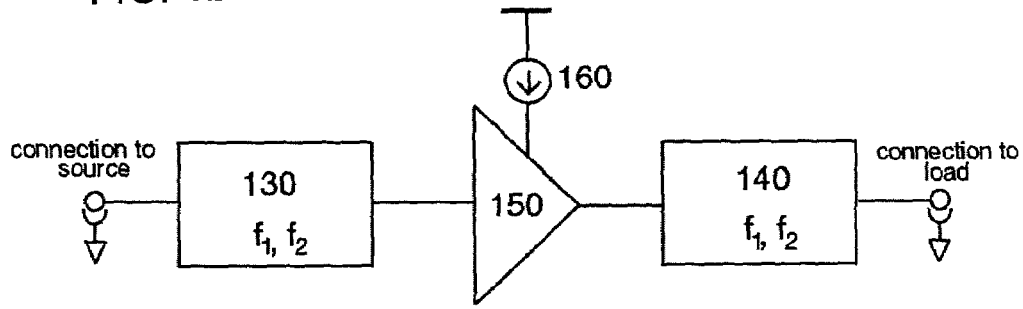
FIG. 1c is a block diagram of a single-stage dual-band, dual-resonant power amplifier of the present invention.

As used herein, a switchless multi-resonant network, is a network that provides the same functionality for each of the design frequencies as a network would in the same place in a single-band amplifier design. FIGS. 1a–1c illustrate this concept. FIG. 1a shows a possible block diagram for a conventional single-stage power amplifier. The input signal enters on the left into input network 20. For a single-band design, input network 20 transforms the input impedance of the active, amplifying device 10, to a desirable value at the signal input at the design frequency $f_1$ and possibly its harmonics. For example, input network 20 conjugately matches the input impedance of the amplifying device to the impedance of the source that injects the signal and provides a very large or very small impedance at the signal harmonics so as to reject those harmonics. The device is powered by a DC-current source 40 and amplifies the signal at frequency $f_1$ injecting it into output network 30. Output network 30 connects a load to the amplifying device 10, and together with the load provides an impedance at the design frequency $f_1$ and its harmonics to the amplifying device 10 that is appropriate for operation in a certain mode, such as the Class-C or Class-F mode of operation. Certain other requirements may be placed on both impedance networks 20 and 30, such as the requirement to filter unwanted signal harmonics to acceptable levels or to keep losses associated with these networks below a set limit.

Within the range of the design parameters, the single-band design will yield various implementations for the blocks depicted in FIG. 1a. In particular, the input and output impedance networks 20 and 30 for a particular design can be characterized in terms of how they modify source and load impedance at the design frequency $f_1$ and its harmonics, how much loss they introduce, whether they provide DC-isolation and how much they suppress unwanted signal harmonics.

Amplifiers operating at different frequencies will require different designs for the blocks in FIG. 1a, and, in particular, the impedance networks 20 and 30. For example, FIG. 1b shows two single-stage amplifiers using the topology shown in FIG. 1a. The amplifier at the top of the diagram includes an input network 50, output network 60, amplifying device 70 and current source 80. This amplifier is designed to operate at a frequency $f_1$. The lower amplifier of FIG. 1b consists of input network 90, output network 100, amplifying device 110, and current source 120 and is designed to operate at a frequency $f_2$. The design frequencies are designated in the impedance networks to indicate their tuning characteristics.

Conceptually, a single path, dual-band power amplifier designed according to the present invention combines the two amplifiers of FIG. 1b in such a way that each impedance network in the dual-band amplifier provides the functionality of the two corresponding networks of the single-band designs. FIG. 1c is a block diagram that shows the combination of the two amplifiers of FIG. 1b into a single path, dual-band amplifier. In particular, input network 130 combines the functionality of input networks 50 and 90, and output network 140 combines the functionality of output networks 60 and 100. The amplifying device 150 of this example is assumed to operate at the higher of the two design frequencies. The DC-current source 160 operates regardless of the operating frequency of the amplifier. Moreover, this single path, multi-resonant network topology offers the ability to concurrently amplify two or more input signals in different frequency bands.

FIGS. 1a–1c illustrate the concept behind designing a single-path, switchless multi-resonant, multi-band power amplifier within the scope of this invention. However, the block diagrams shown in these figures present an example of only one particular arrangement of blocks in a power amplifier. It should be understood that different arrangements and numbers of amplification stages are within the scope of the amplifier of the present invention. For example, the amplifier may or may not be designed as an integrated circuit. As another example, an alternative arrangement would be to design a device that includes an amplifying stage with either an output impedance network 140 or an input impedance network 130, but not both. In the former design, one could supply an external input impedance circuit or could conceivably supply the input signal directly into the input of the amplifying stage. In the latter case, one would likely supply an external output impedance network. It will also be understood that the amplifying device may be any three terminal active device, such as a bipolar or FET transistor, or may be a more complex active circuit.

Figure 2:
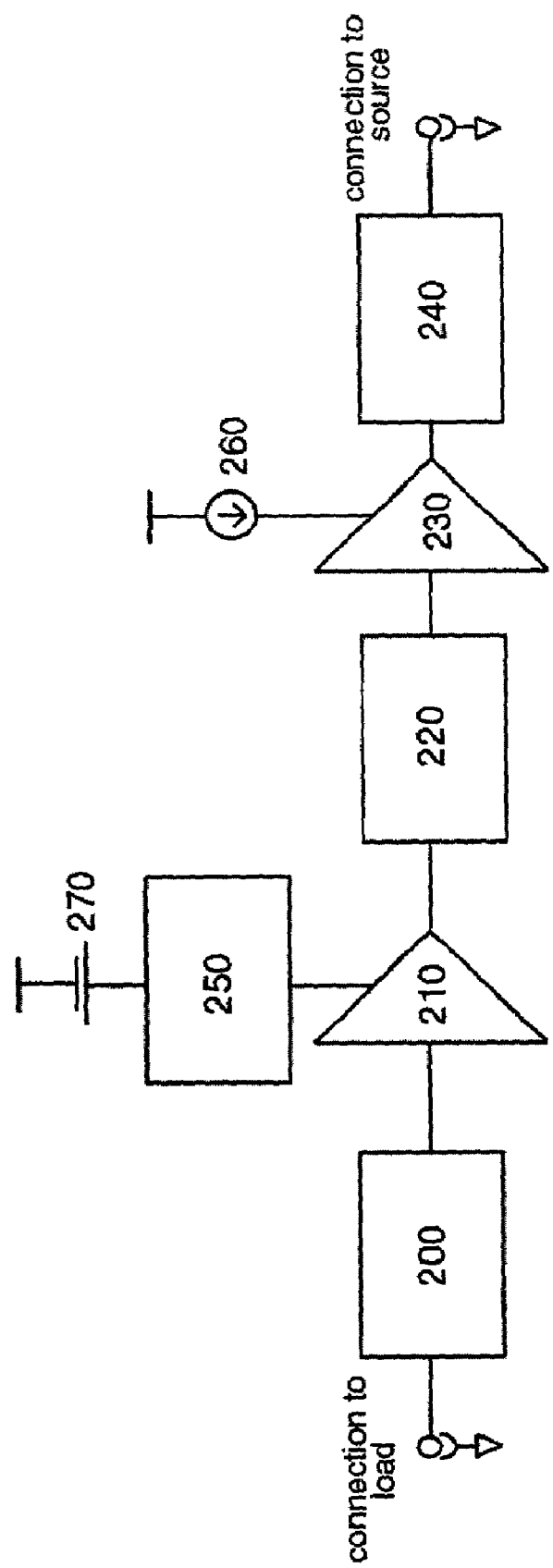
FIG. 2 is a block diagram of an exemplary multi-stage power amplifier of the present invention.

FIG. 2 discloses an alternative embodiment of the present invention, wherein a two-stage power amplifier topology is shown. Input network 200 is connected to a first amplifying state, or amplifying device 210. An amplifying device 210 is powered by a voltage supply 270, connected through a filter network 250. An interstage matching network 220 connects the first amplifying device 210 to a second amplifying stage or device 230. Amplifying device 230 is powered by a DC-current source 260. It delivers the final output signal to the load through an output network 240. In an amplifier, the blocks could perform the following functions: input stage 200 matches the input impedance of device 210 to the signal source. Device 210 amplifies the input signal to a power level suitable to drive device 230. The interstage match 220 matches the output impedance of device 210 to the input impedance of device 230, and furthermore may, together with network 250 shape voltage and/or current waveforms at the output of device 210 in accordance to a particular mode of operation. Finally, the interstage match 220 may perform functionality at harmonics of the signal such as bandpass filtering to shape the signal waveform at the input of device 230 in accordance to a particular mode of operation of amplifying device 230, possibly different from the mode of operation of amplifying device 210. Finally, the output network 240 may match the load to the output of device 230 and shape current and/or voltage waveforms in accordance with the mode of operation of amplifying device 230. The supplies 260 and 270 supply power to the two amplifying devices.

In a switchless multi-resonant, multi-band power amplifier of this invention, the impedance networks 200, 220, 240 and 250 would provide above mentioned and/or desired other functionality at the two or more frequencies of operation and their harmonics.

There are numerous possibilities for power amplifier topologies employing one or more amplifier stages and providing input, interstage and output impedance networks to operate each stage in a desired fashion. The switchless multi-resonant multi-band power amplifier of this invention is not limited to a particular topology, but rather can be implemented with different topologies, provided that impedance networks used provide meaningful functionality at all design frequencies and their harmonics and do not contain means for changing network characteristics based on a supplied frequency-indicating signal (network switches or dependent impedances), or means for routing the signal to separate networks depending on the frequency of operation (diplexers). Impedance networks providing such functionality at more than one design frequency are named switchless multi-resonant networks for the purpose of this invention.

Switchless multi-resonant networks can be implemented in numerous ways, depending on the functionality they are to provide at each design frequency and their harmonics. As the impedance networks used in single-band power amplifiers, multi-resonant networks may include, but are not limited to, capacitors, inductors, transformers and transmission lines, all of which appear in numerous, different forms, including, but not limited to spiral inductors and slab inductors, whether integrated or not, air core inductors, inductors with cores made of magnetizing material, microstrip, stripline or coplanar transmission lines, reversed biased varactor diodes, MOS capacitors, parallel plate capacitors of various technologies, fractal or lateral flux capacitors, transformers with or without a core, and coupled microstrip, coplanar or stripline transmission lines, to name a few, non-limiting examples.

Figure 3A:
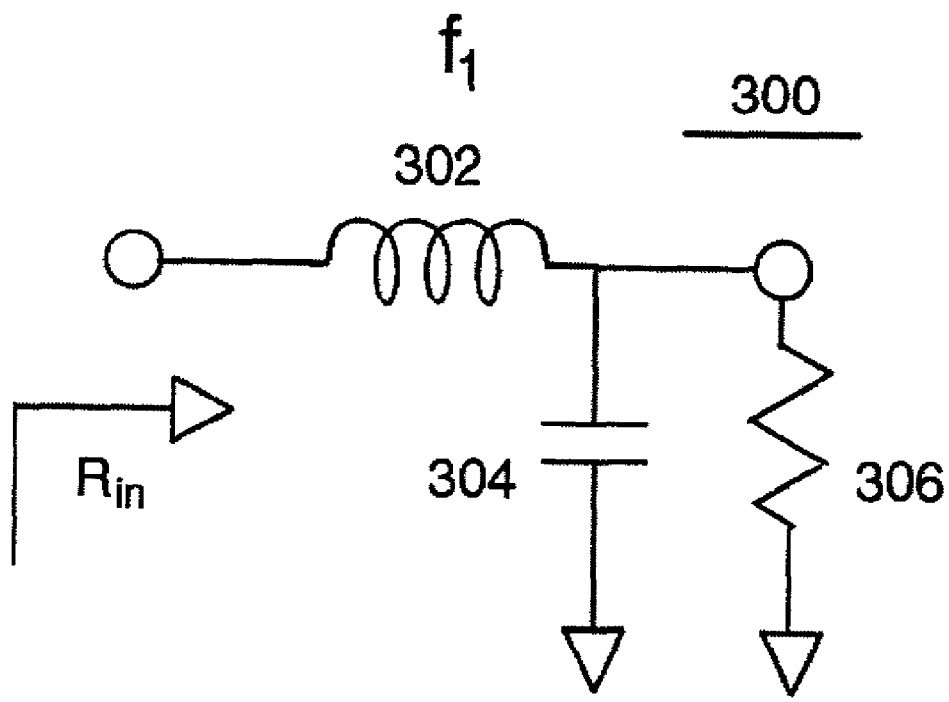
FIG. 3a is an exemplary conventional single-band low-pass L-match circuit.
Figure 3B:
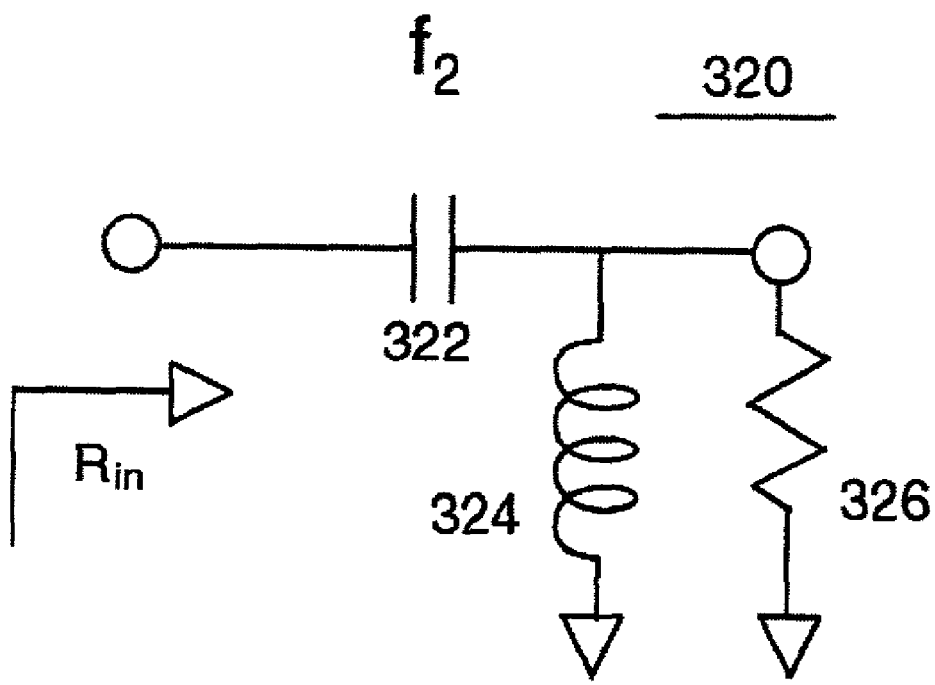
FIG. 3b is an exemplary conventional single-band high-pass L-match circuit.
Figure 3C:
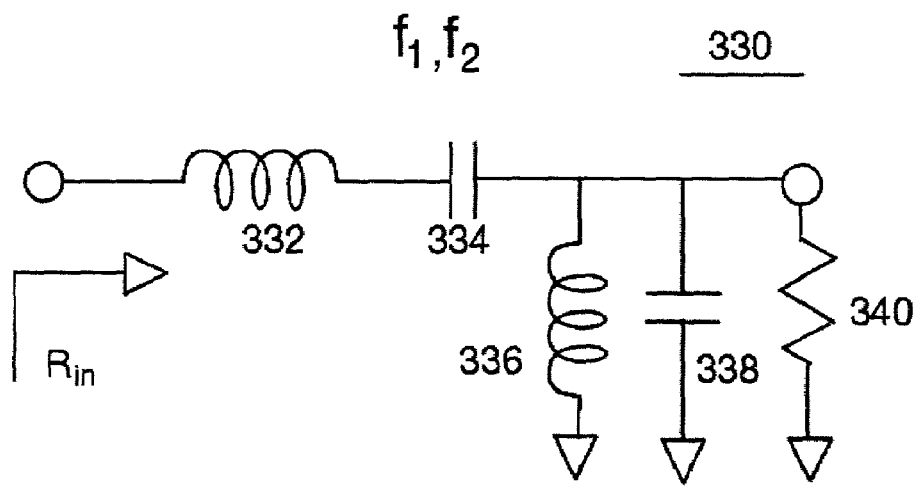
FIG. 3c is a dual-band band-pass L-match circuit that is used as one impedance network according to the present invention.

FIGS. 3a–3c further illustrate the concept of a multi-resonant network with circuit diagrams. FIG. 3c discloses a particular switchless multi-resonant network for use in the amplifier of the present invention. The network is herein called a "dual-band L-match."

FIG. 3a shows a so-called "low-pass L-match" circuit commonly used to transform a load resistance to a lower value at one particular frequency. It is designed by choosing capacitor 304 to have a reactance $X_1$ that will transform resistance 306 at the design frequency $f_1$ to a desired value $R_{in}$. Inductor 302 is used to add positive reactance that cancels the equivalent series reactance of capacitor 304. FIG. 3b shows a so-called "high-pass L-match," where the roles of the capacitor and inductor of FIG. 3a are reversed to accomplish transforming resistance 326 to a lower resistance $R_{in}$ at frequency $f_2$. The two L-matches of FIGS. 3a and 3b can be combined as shown in FIG. 3c to provide the resistive transformations achieved by the networks in FIGS. 3a and 3b at the respective design frequencies $f_1$ and $f_2$. In this example, component values for the network of FIG. 3c are found by observing that inductor 336 and capacitor have total impedance $X_1$ at frequency $f_1$ and impedance $X_2$ at frequency $f_2$, where $X_2$ is the impedance of inductor 324 in FIG. 3b at frequency $f_2$. Particular values for inductor 332 and capacitor 334 are found in an analogous way from the impedance of inductor 302 at frequency $f_1$ and the impedance of capacitor 322 at $f_2$.

The networks shown in FIGS. 3a and 3b could be used in single-band power amplifiers, for example in the output impedance network, to provide load resistance transformation. As an example, one single-band power amplifier operating at frequency $f_1$ may use the network shown in FIG. 3a to transform a given load impedance—for example a 50Ω antenna—to achieve required output power that is not achievable with the untransformed load impedance. Another power amplifier operating at frequency $f_2$ may use the network shown in FIG. 3b to achieve the same. The design of a dual-band power amplifier of this invention could employ the network shown in FIG. 3c to achieve the required transformations at frequencies $f_1$ and $f_2$.

The dual-resonant network of FIG. 3c displays characteristics that the individual networks do not have; namely, it is a band-pass filter. For example, the dual-resonant network of FIG. 3c blocks DC voltages whereas the network of FIG. 3a does not. This can, however, be a desirable characteristic, and one that would likely need to be added to the network of FIG. 3a if it was employed in the output impedance network of a power amplifier. Similarly, the network of FIG. 3b—although it blocks DC-voltages—passes high frequency components, such as harmonic components of the signal frequency. When employed in the output network of a power amplifier, this characteristic is usually undesirable. In comparison, the dual-resonant network of FIG. 3c blocks high-frequency signals. This illustrates the ability of the dual-band power amplifier of this invention to reduce component count compared to a switched-network dual-band amplifier that would switch between modified versions of the networks of FIGS. 3a and 3b, with one components added to each one to provide DC-blocking and harmonic filtering functionality respectively.

Further examples of switchless multi-resonant networks that an amplifier of the present invention may use, but is not limited to, and the design intuition behind them, are shown in FIGS. 4a–4e.

Figure 4A:
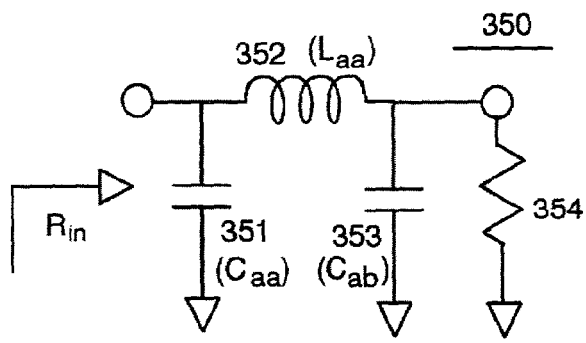
FIG. 4a is an exemplary conventional single-band low-pass π-match circuit.
Figure 4B:
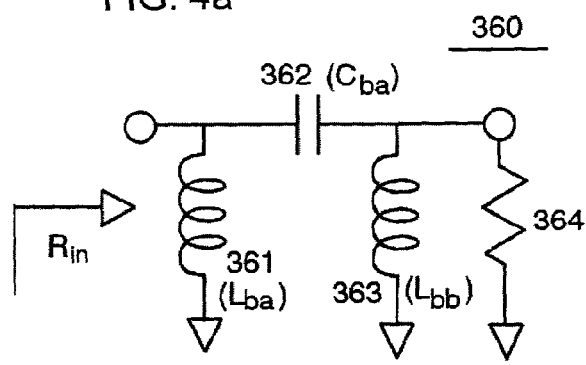
FIG. 4b is an exemplary conventional single-band high-pass π-match circuit.
Figure 4C:
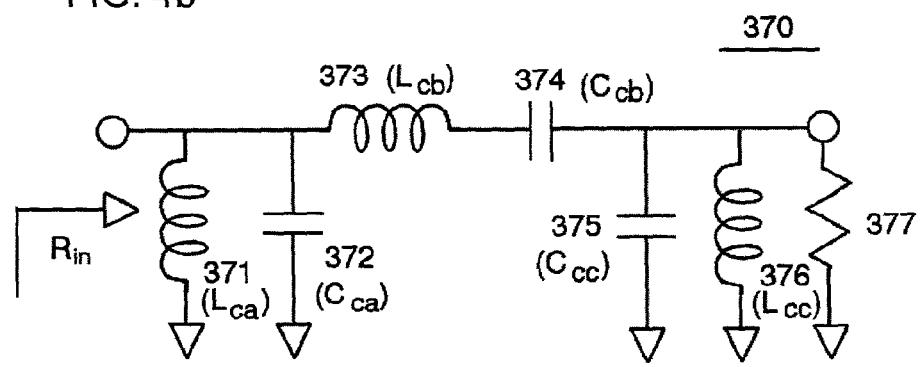
FIG. 4c is an exemplary network circuit that combines the functionality of the impedance networks of FIGS. 4a and 4b to operate as a "dual-band, band-pass, π-match" circuit, according to the present invention.
Figure 4D:
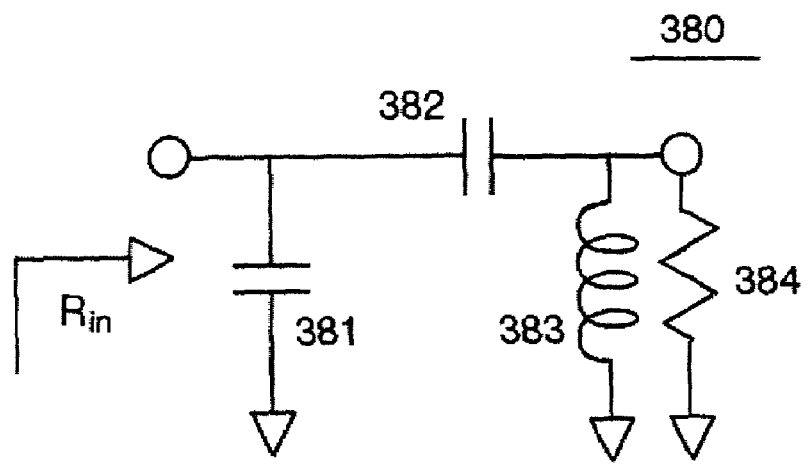
FIG. 4d is a single-band tapped capacitor match circuit.
Figure 4E:
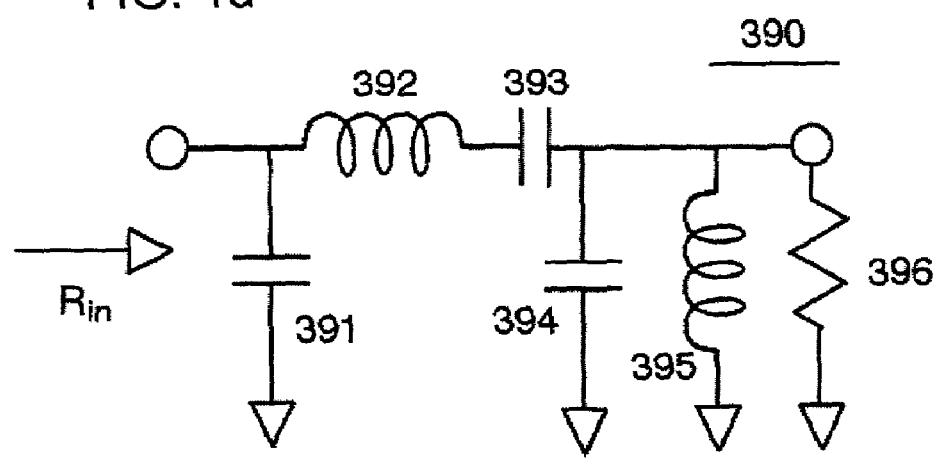
FIG. 4e is an exemplary network circuit that combines the functionality of the impedance networks shown in FIGS. 4a and 4d to operate as a "dual-band, band-pass, match" circuit, according to the present invention.

FIG. 4c shows what could be called a "dual-bandπ-match" circuit that is derived from the conventional networks shown in FIGS. 4a and 4b, operating at frequencies $f_1$ and $f_2$ respectively. An RF circuit designer familiar with the equations for the π-matches of FIGS. 4a and 4b can readily calculate component values for the network of FIG. 4c, observing that the pair of components in each branch of FIG. 4c need to supply the impedance of the components in FIGS. 4a and 4b respectively in the same branch for the frequencies $f_1$ and $f_2$, respectively. Referring to the figures the equations are:

$$-\omega_2 C_{aa} = -\omega_2 C_{ca} + \frac{1}{\omega_2 L_{ca}}$$

$$\frac{1}{\omega_1 L_{ba}} = \frac{1}{\omega_1 L_{ca}} - \omega_1 C_{ca}$$

$$\omega_2 L_{aa} = \omega_2 L_{cb} - \frac{1}{\omega_2 C_{cb}}$$

$$-\frac{1}{\omega_1 C_{ba}} = \omega_1 L_{cb} - \frac{1}{\omega_1 C_{cb}}$$

$$\frac{1}{\omega_2 L_{bb}} = -\omega_2 C_{cc} + \frac{1}{\omega_2 L_{cc}}$$

$$-\omega_1 C_{ab} = -\omega_1 C_{cc} + \frac{1}{\omega_1 L_{cc}}$$

wherein, $\omega_1 = 2\pi f_1$, $\omega_2 = 2\pi f_2$:

FIG. 4e shows a related dual-band impedance network. It combines the networks of FIGS. 4a and 4d with the restriction that the capacitor in the left branch be the same. Component values for the network of FIG. 4e are derived from component values of the networks in FIGS. 4a and 4d in an analogous way as described in connection with FIGS. 3a–c and 4a–c, above.

Figure 5B:
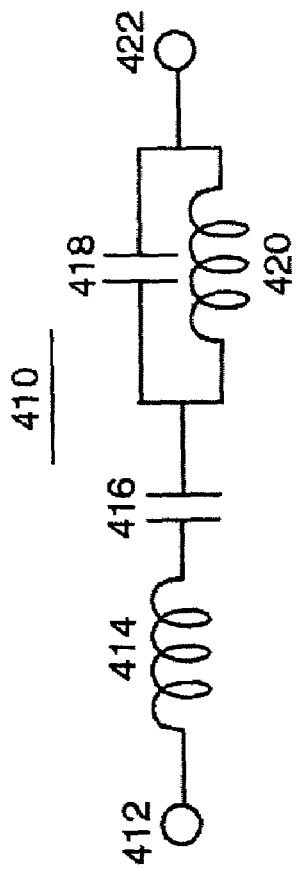
FIG. 5b is an example of a dual-band series circuit that exhibits a series resonance at two different frequencies, $f_1$ and $f_2$.
Figure 5D:
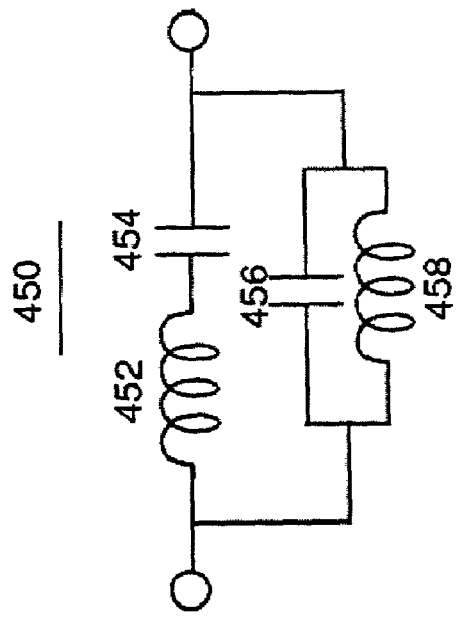
FIG. 5d is a dual-resonant parallel circuit that exhibits a parallel resonance at two different frequencies, $f_1$ and $f_2$.
Figure 5A:
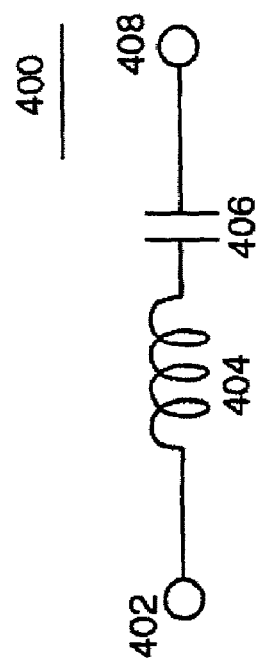
FIG. 5a is an example of a series LC circuit exhibiting a series resonance at a particular frequency.

FIGS. 5a–5d illustrate further examples of switchless dual-resonant networks that an amplifier of the present invention may use. FIG. 5a shows a series LC resonant circuit 400. This type of network exhibits a series resonance at a particular frequency, which is a short circuit connection between the two nodes 402, 408. At frequencies far removed from the resonance frequencies, this circuit exhibits a large impedance that prevents a signal present at one node to be transmitted to the other.

FIG. 5b shows a related dual-resonant network 410. This network exhibits a series resonance at two particular frequencies. Three other equivalent topologies, shown in FIGS. 5e–g, for this network are possible that exhibit the same behavior at all frequencies when properly designed. As shown in the circuit in FIG. 5a, the circuit rejects signals at frequencies far above the second resonance frequency and far below the first resonance frequency. In addition, this network also exhibits a parallel resonance in between the two series resonance frequencies, which could be useful for removing a harmonic component of the lower operating frequency of a dual-band power amplifier, provided that the two frequencies of operation are separated by more than an octave.

It should be understood that component values are found by solving the equation for the impedance of this network with four specified conditions, for example, one component value, the location of the parallel resonance frequency and the locations of the two series resonant frequencies.

Figure 5C:
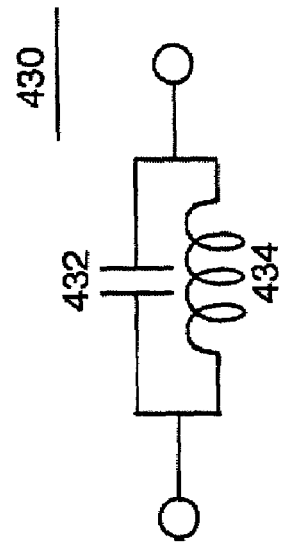
FIG. 5c is an example of a parallel LC circuit exhibiting a parallel resonance at a particular frequency.

FIGS. 5c and 5d show the corresponding networks for single-band and dual-band parallel resonance circuits. The network 430 of FIG. 5c exhibits a parallel resonance at a particular frequency. One possible dual-band extension is the network 450 shown in FIG. 5d, which exhibits a parallel resonance at two frequencies. Three other topologies for the network of FIG. 5d are shown in FIGS. 5h–j. These circuits exhibit the same behavior at all frequencies when properly designed. Component values are derived in an analogous way as for the network of FIG. 5b.

Figure 6A:
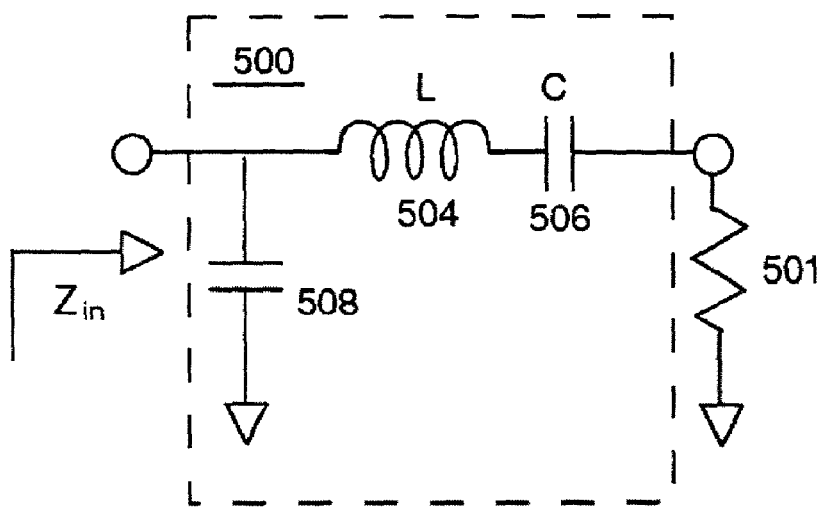
FIG. 6a is a conventional network circuit used for single-band Class-E amplifiers as the load network.
Figure 6B:
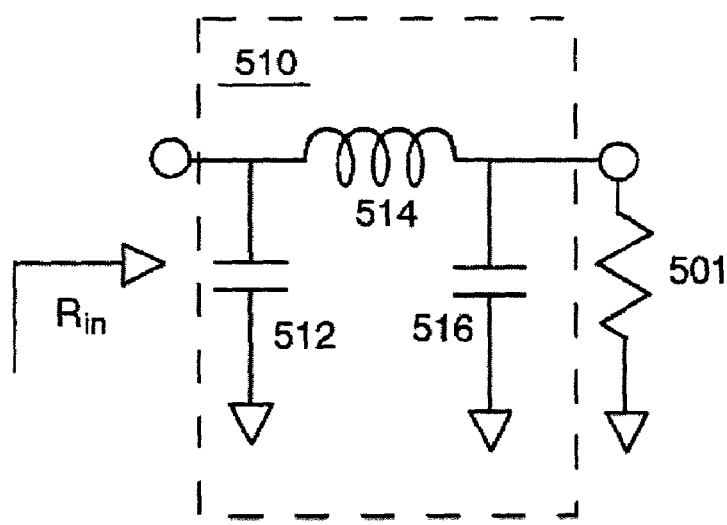
FIG. 6b is a third-order low-pass filter circuit that could replace the load network of FIG. 6a to provide load resistance transformation and additional harmonic filtering.

FIGS. 6a–6e illustrate how cascaded passive stages may be used in a multi-band impedance network. FIG. 6a shows a network 500 commonly used as a Class-E output network. This network, connected to a load R 501, includes an inductor 504 and capacitor 506 series LC connection that blocks DC-voltages and harmonic frequency components, and provides some inductive impedance at the frequency of operation when used in a Class-E power amplifier. A capacitor 508 is used for additional tuning of the fundamental frequencies and all its harmonics, such that the entire network provides the load necessary for Class-E operation at all those frequencies.

The network 500 shown in FIG. 6a acts as a second-order low-pass filter at all harmonic frequencies. Second-order low-pass filters display a characteristic roll-off at high frequencies and in particular provide ideally 12 dB attenuation per octave. Oftentimes, more filtering is needed at harmonic frequencies, in addition to means of transforming the load impedance 501, which could be fixed, such as the 50Ω impedance of a standard antenna. To modify the network of FIG. 6a accordingly, the π-match network 501 shown in FIG. 6b could be used. This match allows the load impedance 501 to be transformed at a particular frequency to a more desirable value. In addition, it acts as a third-order low-pass filter at high frequencies.

Figure 6C:
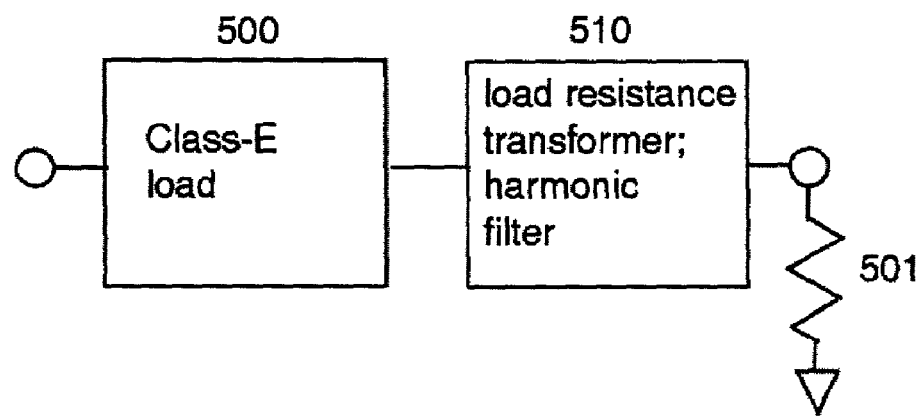
FIG. 6c is a block diagram showing the networks of FIGS. 6a and 6b connected in cascade.
Figure 6D:
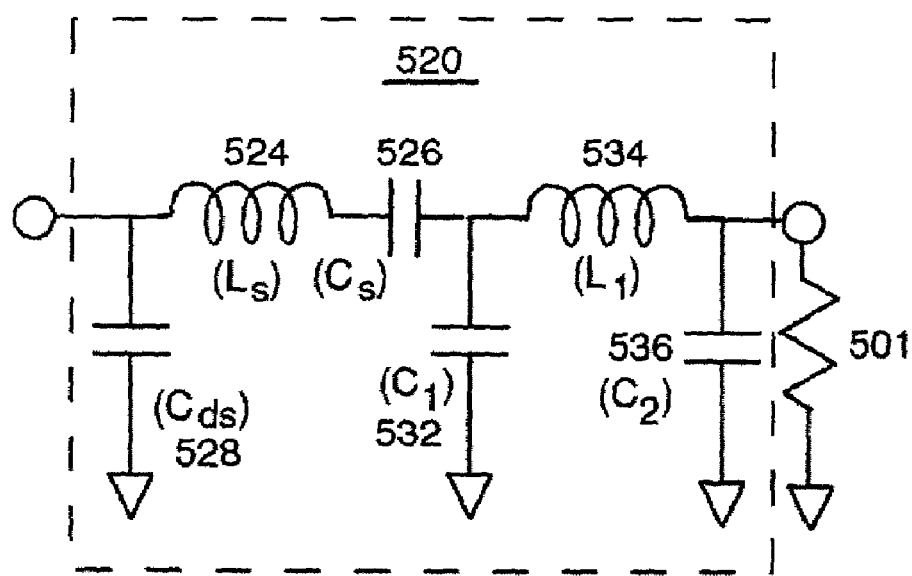
FIG. 6d is a circuit that combines the functionality of the network circuits shown in FIGS. 6a and 6b.

The block-diagram of FIG. 6c shows how these components may be combined in cascade. The two blocks 500 and 501 fulfill the purposes described above. The corresponding circuit diagram is shown in FIG. 6d. Together, these circuits act as a fifth-order low-pass filter 520 at high-frequency, thus providing better filtering, and they allow class-E behavior, DC blocking and impedance transformation.

Figure 6E:
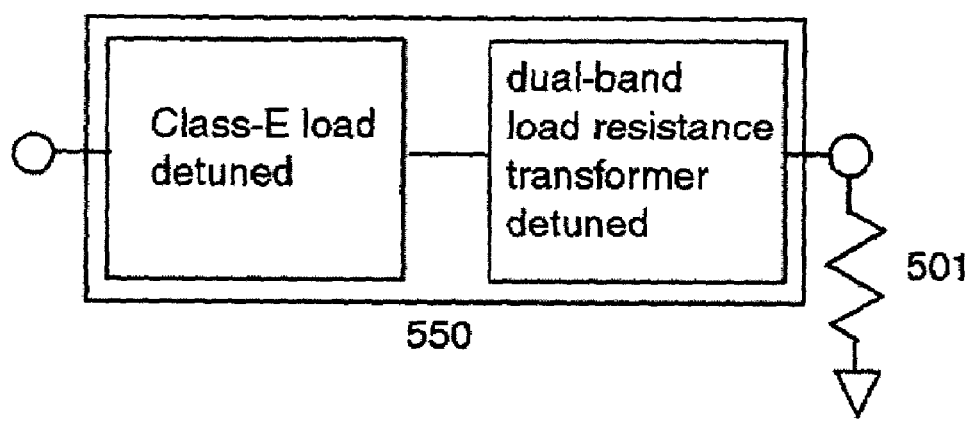
FIG. 6e is a block diagram of the circuit shown in FIG. 6d.

FIG. 6e illustrates how the two blocks of FIG. 6c could be detuned in such a way that together they provide functionality at two desired frequencies of operation. The block 550 around the formerly independent blocks of FIG. 6c illustrates that the two now act in concert, and the functionality is distributed among all components. The three components that formerly acted as a π-match for load impedance transformation and filtering now provide load impedance transformation at two frequencies, which can only be achieved—with a few, unusual exceptions—by detuning the block in such a way that it adds extra reactance to the load at both frequencies. This reactance is not the correct one usually required for correct operation—for example Class-E at the higher frequency and Class-C at the lower frequency. However, the series combination of inductor 504 and capacitor 506 of the former Class-E load are also detuned such that they modify the reactance in the desired way for correct operation at both frequencies. The independently operating single-band blocks 500 and 510 of FIG. 6c are now operating as one unit for a dual-resonant output impedance network.

The calculation of specific component values for a particular purpose is more involved than in the previous examples, but can be achieved with the aid of numerical programs. Values obtained for a particular design are detailed further below.

The above examples illustrate only a few examples of how to arrive at designs for switchless, multi-resonant networks that could be designed into a switchless multi-resonant, multi-band power amplifier. Furthermore, only networks using capacitors and inductors were included in the examples. However, depending on manufacturing technology, performance, specific application and other design considerations, other components, including spiral inductors and slab inductors, whether integrated or not, air core inductors, inductors with cores made of magnetizing material, microstrip, stripline or coplanar transmission lines, reversed biased varactor diodes, MOS capacitors, parallel plate capacitors of various technologies, fractal or lateral flux capacitors, transformers with or without a core, and coupled microstrip, coplanar or stripline transmission lines may be used, to name a few, non-limiting examples. The defining characteristic of a multi-resonant network is its ability to transform a source or load impedance at the design frequencies or frequency bands and their respective harmonics to be suitable for a given mode of amplifier operation and to not include devices which are selectively coupled or modified depending on the band of current operation. This invention describes multi-band power amplifiers using all such impedance transforming networks.

Exemplary Dual-Band Power Amplifier—Topology No. 1

Figure 7:
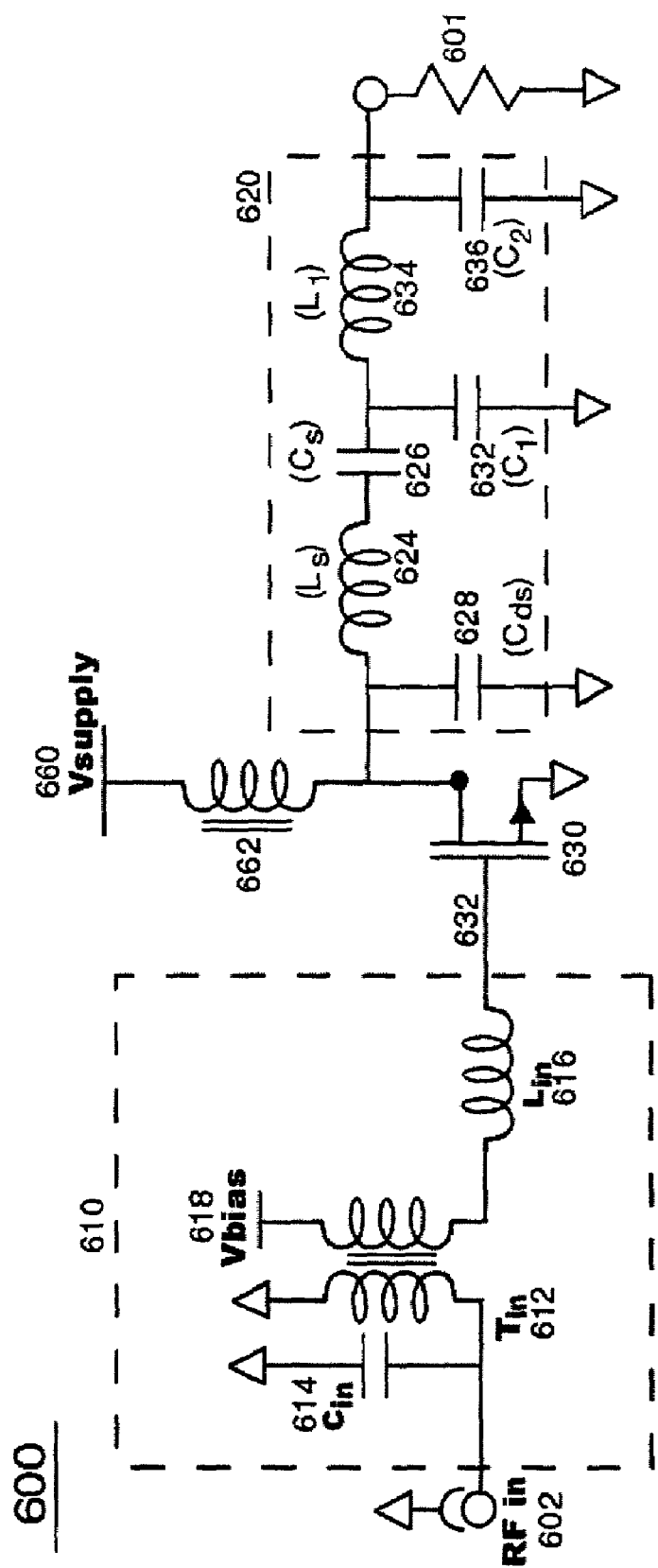
FIG. 7 is a diagram of one possible implementation of a dual-band power amplifier designed according to the present invention.

FIG. 7 is an exemplary schematic showing how multi-resonant networks can be combined with an amplifying device to yield a multi-band power amplifier of this invention.

The amplifier 600 shown is a single-stage amplifier consisting of a dual-band input impedance network 610, a transistor 630 suitable for operation in two frequency bands, $f_1$ and $f_2$, given by a particular need, a switchless dual-band output impedance network 620, and a voltage supply 660 connected through an RF choke 662 to supply DC current.

The input impedance network, consisting of $T_{in}$ 612, $C_{in}$ 614 and $L_{in}$ 616, transforms the impedance of an RF signal source connected to the $RF_{in}$ port 602 to a value suitable to drive the transistor input 632 at both the design frequencies. Preferably, it will conjugately match the source with the transistor input impedance. $T_{in}$ is assumed to have a particular value of magnetizing inductance, which is used for the transformation at the two frequencies. This input impedance network is similar to the one shown in FIG. 3c, where the series capacitor 334 has been removed, and the parallel inductor 336 has been replaced with the transformer $T_{in}$ 612. The transformer 612 provides initial impedance transformation of the source impedance and the capacitor 614. Furthermore, it provides DC-isolation. The transformed value of $C_{in}$ 614 and the magnetizing inductance of $T_{in}$ 612 provide reactances $X_1$ and $X_2$ at the two design frequencies $f_1$ and $f_2$, suitable to change the transformed resistive part of the load impedance to a final, desired value at the two frequencies $f_1$ and $f_2$. Because there are three degrees of freedom—choice of turns ratio, value of magnetizing inductance and the value of $C_{in}$ 614—the remaining degree of freedom is used to provide reactance for the transformed impedance at the frequencies $f_1$ and $f_2$ that will yield the desired final, transformed source impedance at those two frequencies as seen from the input 632 of the transistor. In other words, the network allows four degrees of freedom, which are used to set transformed source resistance and reactance at two frequencies to arrive at a preferably conjugate match to the transistor input impedance at the two design frequencies.

Besides source impedance transformation, it is noted that the input impedance network 610 also provides DC-isolation and high-frequency harmonic attenuation, suitable when the transistor should be driven by a single-tone at either frequency of operation. Furthermore, a bias voltage for the transistor can be applied at $V_{bias}$ 618.

The output impedance network 620 used in this example is the one shown in FIG. 6d. As explained earlier, this network can be tuned to provide load impedance at the two intended frequencies or frequency bands of operation and their respective harmonics in accordance with the requirements for a particular mode of operation of the amplifier and required output power at both frequencies or frequency bands.

For example, the network topology of FIG. 6d was evaluated for a prototype Class-E*/Class-E switchless dual-resonant output impedance network for the 7 and 10 MHz frequency bands; Class-E* referring to a zero-voltage switching amplifier sometimes referred to as suboptimum Class-E. Component values were calculated to be: $C_{ds}$=124 pF, $C_s$=455 pF, $L_s$=2.3 µH, $C_1$=638 pF, $L_1$=852 nH, $C_2$=670 pF. The prototype amplifier achieved 85% drain efficiency with 400 mW output power at 7 MHz and 60% drain efficiency with 600 mW output power at 10 MHz. Another set of values used in simulations performed after initial implementation to obtain improved current and voltage waveforms was $C_{ds}$=140 pF, $L_s$=2.51 µH, $C_s$=277 pF, $C_1$=614 pF, $L_1$=850 nH, $C_2$=750 pF for the same bands of operation. Simulated efficiencies were 90% at approximately 800 mW output power in both bands.

Finally, DC-current is supplied by a voltage source connected to $V_{supply}$ 660 connected through an RF-choke 662 that already has high impedance at the lowest of the frequencies of operation.

It should be noted that this topology may also be suitable as one of the various buffer and driver stages in a multi-stage amplifier either as is or with modifications obvious to one familiar with the art, because the load driven or the source supplying power may be another amplifier stage. Modifications may include, but are not limited to, connecting parts of the output impedance network or a modified version thereof to the supply, as is oftentimes seen in driver-stages of single-band power amplifiers, to allow high-frequency components to appear at the load, which could be useful if the load is a saturated mode power amplifier. Furthermore, the transistor, which is shown as a generic FET is readily replaced with a different kind, suitable for the technology available to implement the switchless multi-resonant, multi-band power amplifier of this invention, including, but not limited to a Silicon MOSFET, GaAs MESFET, GaAs HBT, Silicon BJT, SiGe HBT or GaAs HEMT to name a few examples. Finally, additional components in this particular example can be used to extend operation to three or more bands.

Exemplary Dual-Band Power Amplifier—Topology No. 2

Figure 8:
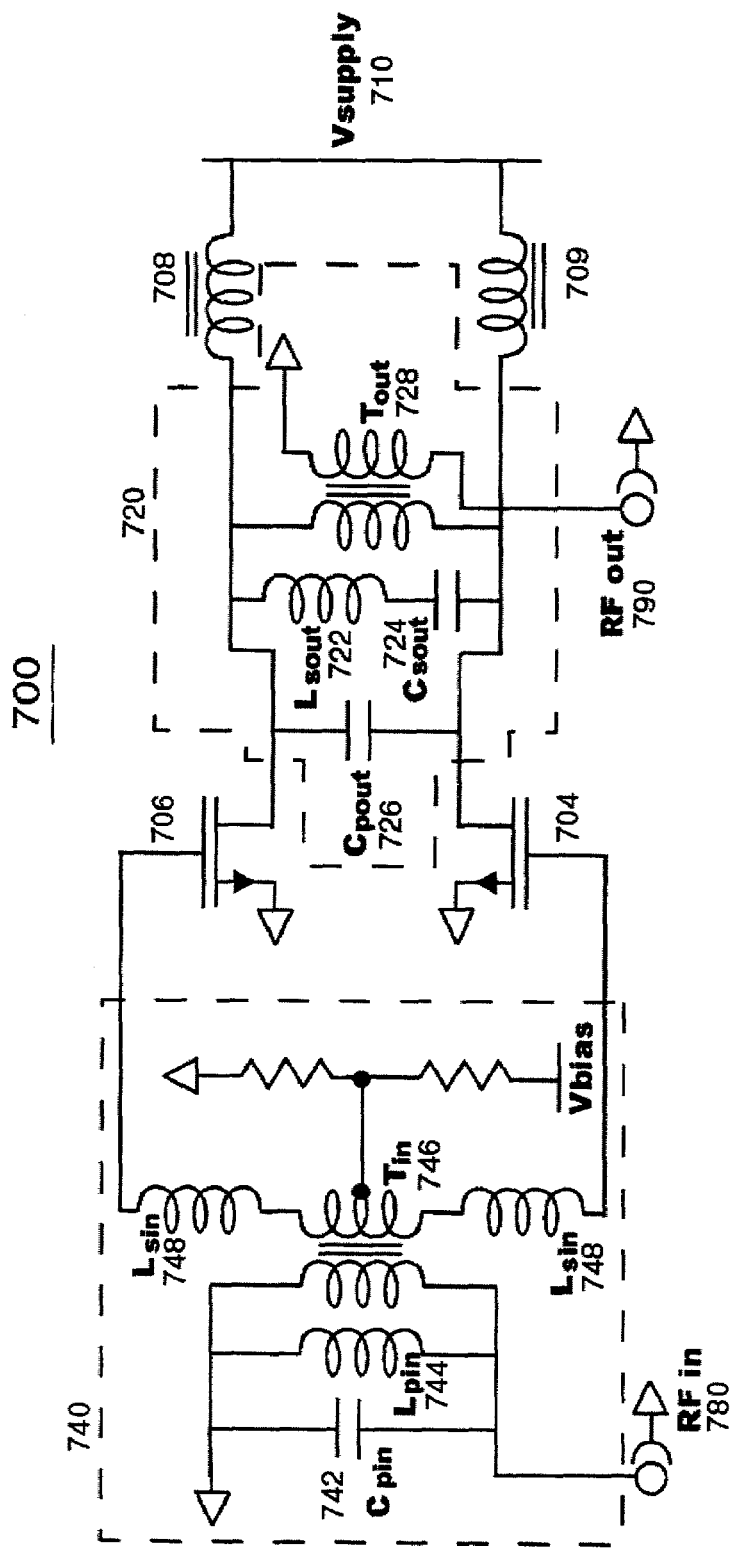
FIG. 8 is a circuit diagram of an alternative embodiment of the single-path, dual-band amplifier of the present invention, wherein the amplifying stage is a differential pair.

Another possible embodiment of the present amplifier is shown in the schematic of FIG. 8. The amplifier shown may operate in a variety of modes discussed below and was implemented for operation in Class E/F in the 7 MHz and 10 MHz frequency bands. The schematic shows a differential amplifier using two MOSFETs 704, 706 as the amplifying devices. DC power is supplied by a current source, which is implemented by large value choke inductors 708, 709 connected to a voltage supply 710. The dual-resonant output network 720 in the schematic consists of $L_{sout}$ 722, $C_{sout}$ 724, $C_{pout}$ 726, and the balun $T_{out}$ 728, which also supplies parallel inductance used as part of the output impedance network. The dual-resonant input impedance network 740 consists of $C_{pin}$ 742, $L_{pin}$ 744, $T_{in}$ 746, and $L_{sin}$ 748. Possible modes of operation-depending on bias and output network tuning-include Class-A, Class A/B, Class-B, Class-C, inverse Class-F (also known as current-mode Class-D), and Class $E/F_{odd}$.

An experimental implementation was designed to operate in the Class $E/F_{odd}$ mode of operation. This implementation requires the amplifier to be driven into deeply saturated mode. The bias voltage is selected to bias the transistors on the threshold of conduction. The input impedance network is tuned to preferably conjugately match the source impedance to the transistor input impedance for frequencies in the two bands of operation. In the experimental amplifier, it was necessary to match a transistor input impedance of low resistance (order of $2\Omega$) in series with capacitive reactance of the same order to a $50\Omega$ source impedance for frequencies in both bands. $C_{pin}$ 742 and $L_{pin}$ 744 are chosen to provide initial resistive transformation in addition to inductive reactance in the 7 MHz band and capacitive reactance in the 10 MHz band of operation. The resistive part of the input impedance is transformed to the desired value in both bands by the input transformer $T_{in}$ 746, here $2\Omega$. The additional reactance added by $C_{pin}$ 742 and $L_{pin}$ 744 are tuned to the final value for frequencies in both bands of operation by the inductors $L_{sin}$ 748. For the experimental implementation, $L_{sin}$ 748 is made of four turns of AWG23 magnetic wire with a diameter of approximately 5 mm yielding 130 nH of inductance. $L_{pin}$ 744 is made of 17 turns of AWG23 wire on a T37-6 toroid core, providing approximately 900 nH inductance. The capacitor $C_{pin}$ 742 is a combination of a 470 pF 50V chip capacitor in parallel with a 7–70 pF variable capacitor to achieve approximately 510 pF total capacitance with provision for on board fine-tuning. The input transformer/balun $T_{in}$ 746 has a turn's ratio of 4:1. Measured input voltage standing wave ratios are 1.7 and 1.4 at the mid-band frequencies of 7.15 MHz and 10.1 MHz for large signal Class $E/F_{odd}$ operation, indicating a very good input match for both bands of operation.

For other modes of operation, the transistor bias voltage is adjusted in accordance with the requirements of the particular mode and input impedance network components may be adjusted to provide different source impedance transformation in both bands.

For the experimental implementation of the dual-band Class $E/F_{odd}$ power amplifier, the output impedance network is tuned to provide inductive susceptance at both fundamental frequencies of operation needed to resonate with the large-signal transistor output capacitance, and to further provide a low-impedance path to (a virtual) ground at all odd order harmonics of frequencies in both bands of operation. The differential topology chosen provides high-impedance at all even order harmonics for frequencies in both bands of operation. These three conditions yield correct tuning for Class $E/F_{odd}$ operation for frequencies in both bands of operation. The output network chosen consists of the components $L_{sout}$ 722, $C_{sout}$ 724, $T_{out}$ 728 and $C_{pout}$ 726 as described above. This network is a modified version of the network also shown in FIG. 5d with $T_{out}$ 728 replacing the inductor 452 of that figure, allowing a differential-to-single-ended output signal transformation. The transformer 728 is made of five air turns of semi-rigid $50\Omega$ coaxial cable, employing the copper outside as the primary and the inside conductor as the secondary. The turn diameter is approximately one inch to provide the theoretical value of 285 nH inductance for this network. A 1 nF ATC100E capacitor is chosen for $C_{pout}$ 726, and two parallel triplets of ATC180R 100 pF capacitors connected in series are used for $C_{sout}$ 724 to provide 150 pF of capacitance. A single capacitor may be used alternatively, but was not available at the time of implementation for this particular amplifier. Finally, $L_{sout}$ 722 is made of eight turns of copper ribbon wire with a diameter of approximately 2.5 inches to provide an inductance of 2.33 μH. The transistors chosen in this implementation are two IRFP250N MOSFETs.

For operation in Class $E/F_{odd}$ mode, this output network exhibits a parallel resonance slightly above both bands of operation, and provides slightly inductive susceptance in the bands for tuning out the transistor capacitance.

For inverse Class-F operation, the tuning is adjusted to exhibit a parallel resonance in the bands of operation. For Class-A, Class A/B, Class-B and Class C operation, the output network is tuned slightly inductive to resonate with the effective transistor output capacitance for frequencies in both bands of operation. This effective capacitance may be different from the capacitance observed for Class $E/F_{odd}$ mode of operation.

Figure 9:
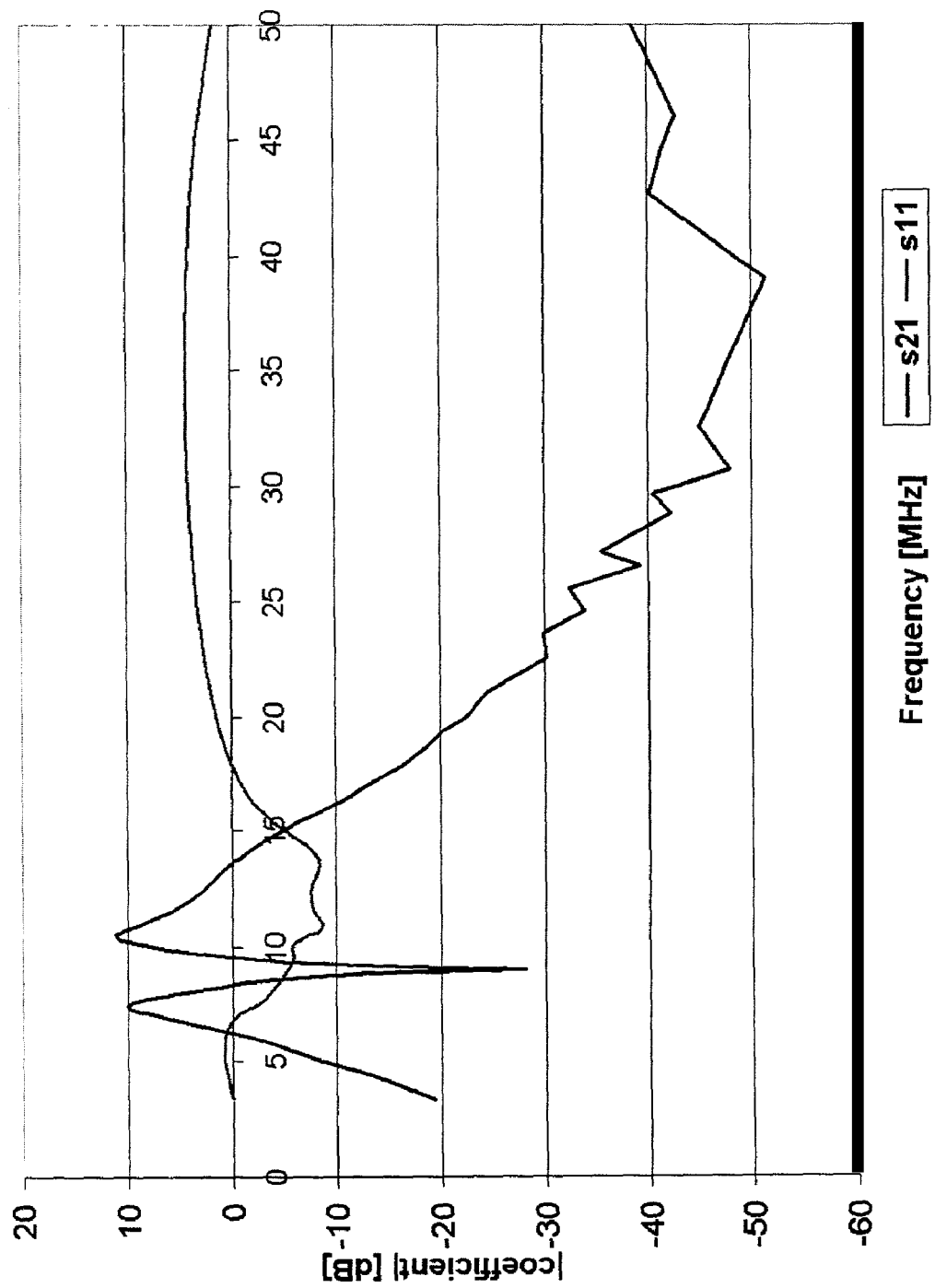
FIG. 9 is graph showing the scattering parameters for small input signals injected into the $RF_{in}$ port as a function of frequency for the amplifier of FIG. 8.

The amplifier was biased for Class-A operation with a total DC supply current of 40 mA and supply voltage of 35V. Scattering parameters are shown in FIG. 9 for small input signals injected into the $RF_{in}$ port 780 (port 1), and leaving the amplifier at the $RF_{out}$ port 790 (port 2).

Figure 10:
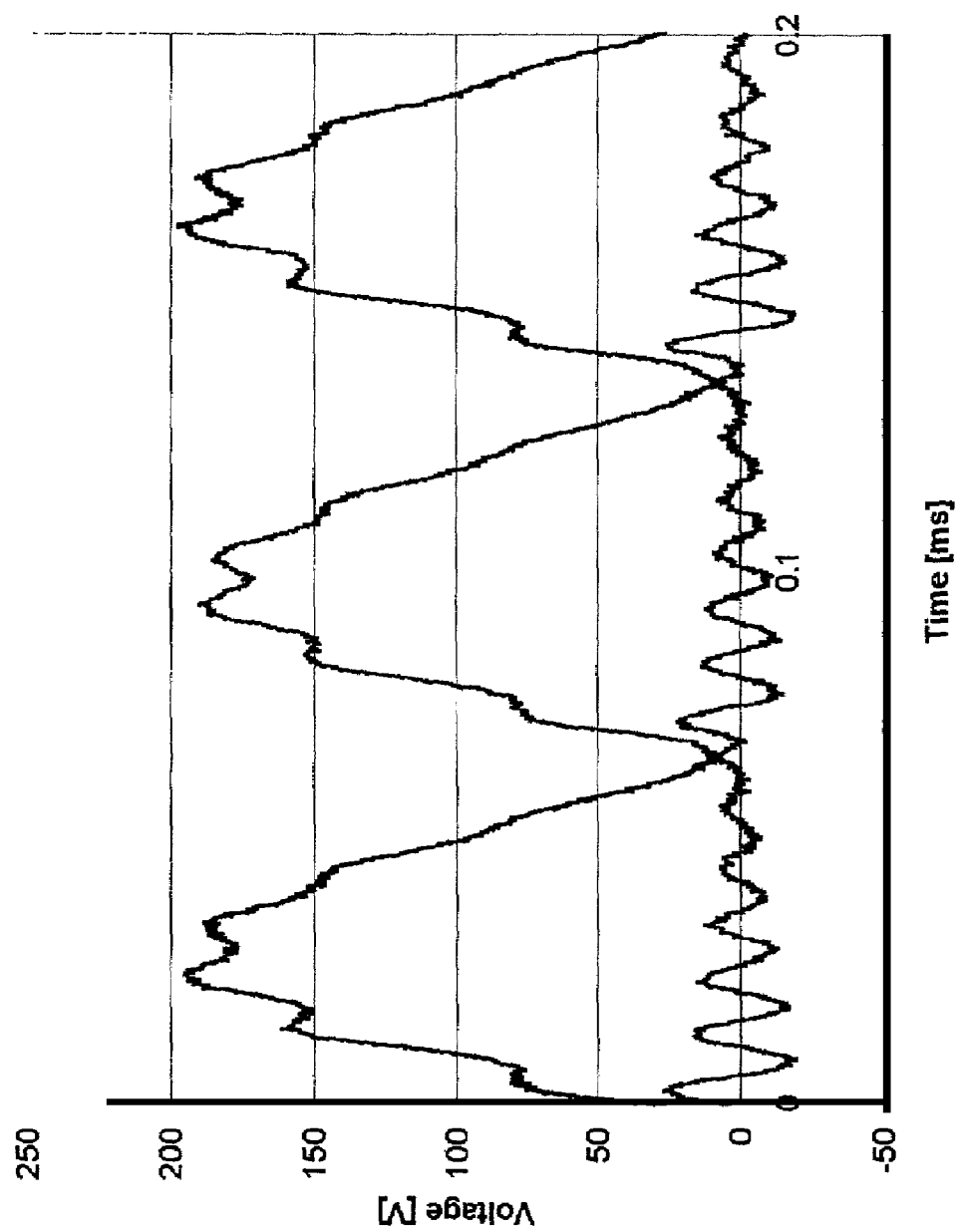
FIG. 10 is a graph showing the drain voltage waveforms of the amplifying transistors of FIG. 8 for operation at 7.15 MHz.
Figure 11:
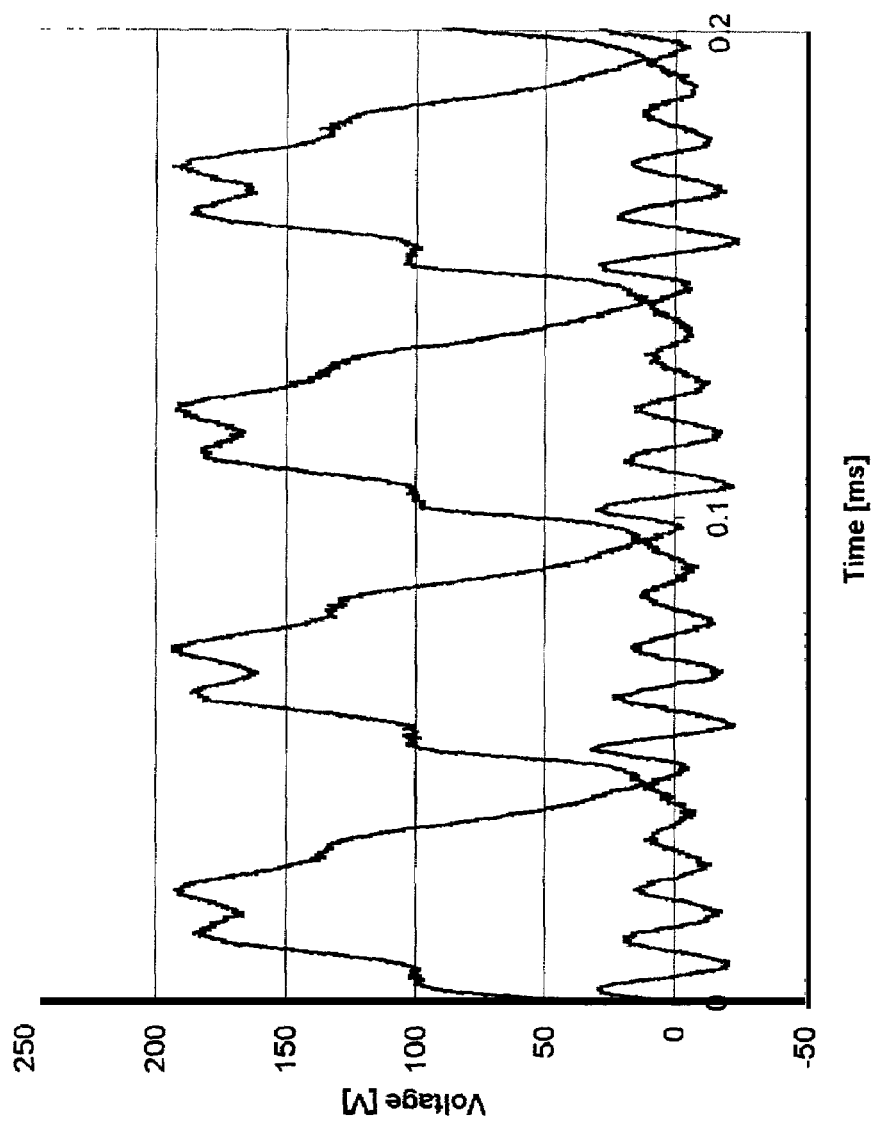
FIG. 11 is a graph showing the drain voltage waveforms of the amplifying transistors of FIG. 8 for operation at 10.1 MHz.

Large signal operation in Class E/Fodd mode is achieved with this amplifier by setting supply voltage 710 to 58V and applying a 5.6 W signal in the 7 MHz band or a 6.8 W input signal in the 10.1 MHz band. The gain provided by this implementation is 16 dB for signals in the 7 MHz band and 15 dB for signals in the 10 MHz band. The amplifier is operating with power-added efficiency of 92% and 87% in those two bands respectively. Voltage waveforms as measured at the drains of the transistors for operation at 7.15 MHz are shown in FIG. 10. Voltage waveforms as measured at the drains of the transistors for operation at 10.1 MHz are shown in FIG. 11.

Figure 12:
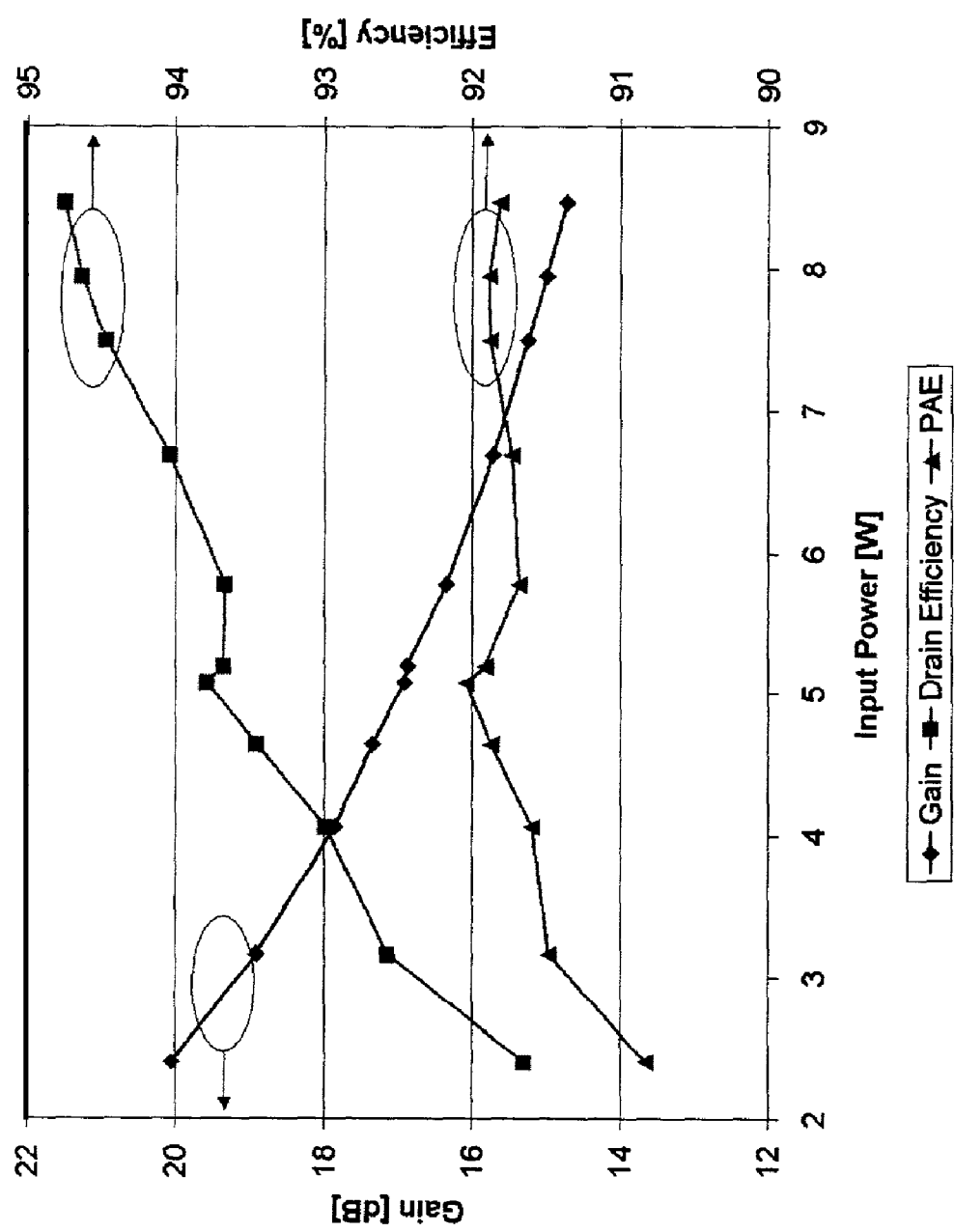
FIG. 12 is a graph showing the gain, drain efficiency and PAE versus signal input power for the power amplifier of FIG. 8 over a range of frequencies for signals at 7.15 MHz running at 58V supply voltage.
Figure 13:
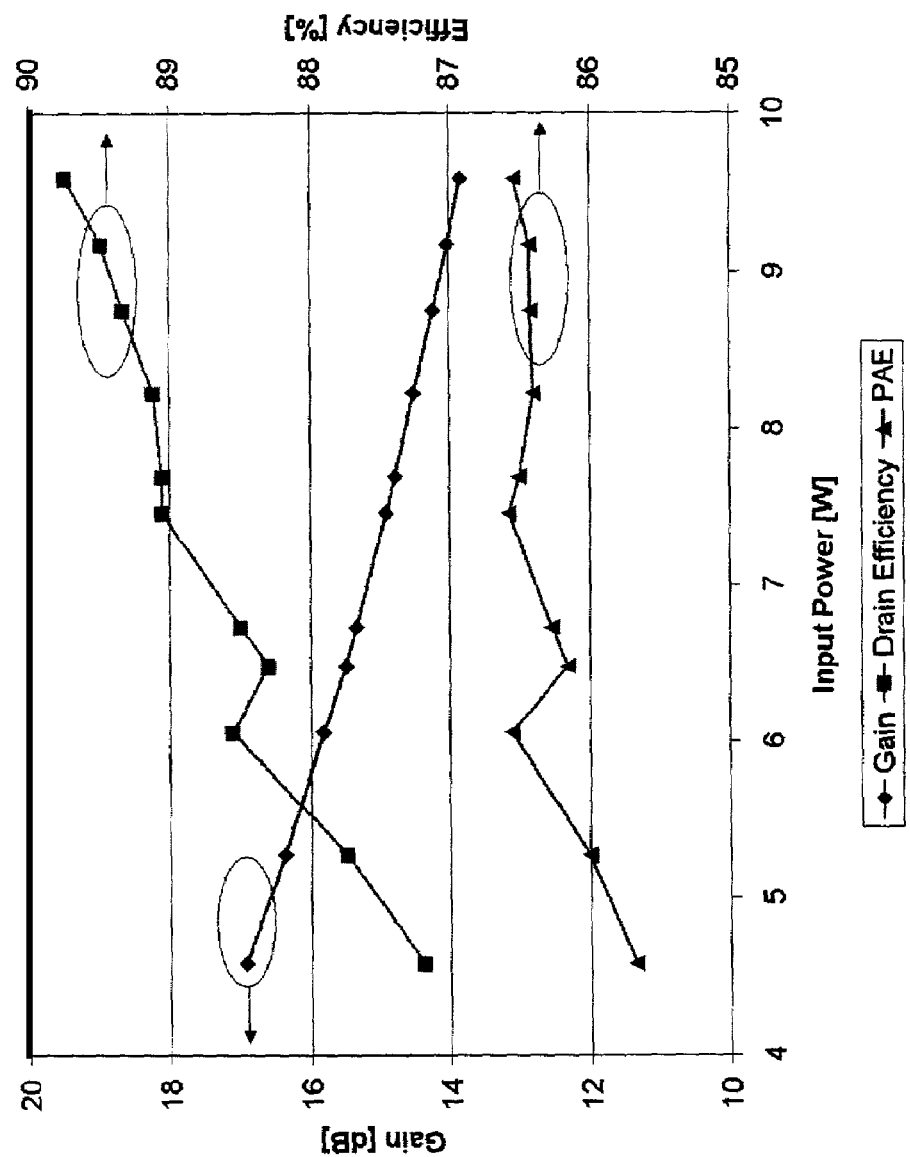
FIG. 13 is a graph showing the gain, drain efficiency and PAE versus signal input power for the power amplifier of FIG. 8 over a range of frequencies for signals at 10.1 MHz running at 58V supply voltage.

The signal input power may be varied over some range for frequencies in both bands of operation, yielding the results shown in FIG. 12 for signals at 7.15 MHz and in FIG. 13 for signals at 10.1 MHz.

Input and output impedance networks different from the ones employed in this implementation could possibly be used to achieve tuning necessary for Class $E/F_{odd}$ mode of operation or a different mode of operation including, but not limited to Class A, Class A/B, Class B, Class C, and inverse Class-F.

The schematics shown in FIGS. 7 and 8 are two examples of possible implementations of switchless multi-resonant, multi-band power amplifiers of this invention. Other topologies, including ones with more stages and capable of amplifying signals in more than two frequency bands. The above examples were chosen to illustrate the nature of the switchless multi-resonant, multi-band power amplifier of this invention; in particular, the use of switchless multi-resonant impedance networks that do not rely on frequency-band indicating signals or signal-routing means such as diplexers.

The present invention provides a generic approach to the design of switchless multi-resonant, non-concurrent and concurrent multi-band power amplifiers. Having thus described exemplary embodiments of the invention, it will be apparent to those skilled in the art that this invention is not limited to any particular choice of topology, operation mode or transistor technology, but can be implemented in any technology suitable for implementation of comparable single-band power amplifiers for the intended use. All such switchless multi-resonant, multi-band power amplifiers are within the scope of this invention in accordance with the following claims.

We claim:

1. A single-path, multi-band amplifying apparatus for amplifying a signal having a frequency in (any) one of a plurality of predetermined frequency bands, comprising:
   (a) first amplifying stage means having a signal input and a signal output, for amplifying the signal; and
   (b) switchless, multi-resonant, output impedance network having an input port connected to the signal output of the amplifying stage for providing a predetermined output impedance at any frequency in the one of the plurality of predetermined frequency bands of the signal independent of an externally-applied, frequency-indicating control signal.

2. The amplifying apparatus of claim 1, further including an input impedance network means having an output port connected to the signal input of the first amplifying stage means.

3. The amplifying apparatus of claim 2, wherein the input impedance network means comprises switchless, multi-resonant, input impedance network means for providing a predetermined input impedance at each frequency in the one of the plurality of predetermined frequencies of the signal independent of an externally-applied, frequency-indicating control signal.

4. The amplifying apparatus of claim 1, wherein the amplifying stage means is three-terminal active device means.

5. The amplifying apparatus of claim 4, wherein the three-terminal active device means is a CMOS transistor.

6. A single-path, multi-band amplifying apparatus for amplifying a signal having a frequency in (any) one of a plurality of predetermined frequency hands, comprising;
   (a) amplifying means having a signal input and a signal output, for amplifying the signal; and
   (b) switchless, multi-resonant, input impedance network means having an output port connected to the signal input of the amplifying stage for providing a predetermined input impedance at each frequency in the one of the plurality of predetermined frequency bands of the signal independent of an externally-applied, frequency-indicating control signal.

7. A single-path concurrent, multi-band, amplifying apparatus for substantially simultaneously amplifying a plurality of signals each having a frequency within a different one of a plurality of predetermined frequency bands, comprising:
   (a) amplifying means having a signal input and a signal output, for amplifying the signals; and
   (b) switchless, multi-resonant, output impedance network means having an input port connected to the output of the amplifying stage for providing a predetermined output impedance at the frequency of each of the signals independent of an externally-applied, frequency-indicating control signal.

8. The apparatus of claim 7, further including an input impedance network.

9. The apparatus of claim 8, wherein the input impedance network means includes switchless, multi-resonant, input impedance network means having an output port connected to the signal input of the amplifying stage for providing a predetermined input impedance at the frequency of each of the signals independent of an externally-applied, frequency-indicating control signal.

* * * * *